United States Patent
Song et al.

(10) Patent No.: US 6,821,901 B2
(45) Date of Patent: Nov. 23, 2004

(54) METHOD OF THROUGH-ETCHING SUBSTRATE

(75) Inventors: Seung-jin Song, 5-505, Miju Apt., Cheongryangri-dong, Dongdaemun-gu, Seoul (KR); Kyoungdoug Min, 111-1802, Gwanakdreamtown, 1712, Bongcheon5-dong, Gwanak-gu, Seoul (KR); Young-chang Joo, 12-406, Gaepo2cha Wooseong Apt., Daechi1-dong, Gangnam-gu, Seoul (KR); Hong-seok Min, Gwangju (KR); Sejun Kim, Seoul (KR); Kun-joong Park, Seoul (KR)

(73) Assignees: Seung-Jin Song, Seoul (KR); Kyoungdoug Min, Seoul (KR); Young-Chang Joo, Seoul (KR)

( * ) Notice: Subject to any disclaimer, the term of this patent is extended or adjusted under 35 U.S.C. 154(b) by 329 days.

(21) Appl. No.: 10/084,622

(22) Filed: Feb. 28, 2002

(65) Prior Publication Data

US 2003/0162402 A1 Aug. 28, 2003

(51) Int. Cl.$^7$ ............................................. H01L 21/311
(52) U.S. Cl. ....................... 438/700; 438/709; 438/710; 438/714; 438/717; 438/719
(58) Field of Search ................................ 438/386–390, 438/700, 709–712, 717, 719, 714; 381/174

(56) References Cited

U.S. PATENT DOCUMENTS

| | | | | |
|---|---|---|---|---|
| 5,131,978 A | * | 7/1992 | O'Neill | 216/2 |
| 5,770,076 A | * | 6/1998 | Chu et al. | 210/490 |
| 5,798,042 A | * | 8/1998 | Chu et al. | 210/490 |
| 5,889,872 A | * | 3/1999 | Sooriakumar et al. | 381/174 |
| 2001/0033670 A1 | * | 10/2001 | Tai et al. | 381/174 |
| 2002/0115293 A1 | * | 8/2002 | Ghodsian | 438/689 |

FOREIGN PATENT DOCUMENTS

| | | |
|---|---|---|
| KR | 1998-11881 | 4/1998 |
| KR | 2001-84240 | 9/2001 |

OTHER PUBLICATIONS

A.A. Ayon, et al., "Characterization of a Time Multiplexed Inductively Coupled Plasma Etcher", *Journal of the Electrochemical Society*, 1999, 339–349 pp., vol. 146 ( 1), The Electrochemical Society, Inc., Cambridge, Massachusetts, USA.

Luc G. Frechette, et al., "Demonstration of a Microfabricated High–Speed Turbine Supported on Gas Bearings", *Solid–State Sensor and Actuator Workshop Hilton Head Is., SC*, Jun. 4–8, 2000, 1–5 pp., Gas Turbine Laboratory and Microsytems Technology Laboratories Massachusetts Institute of Technology, Cambridge, Massachusetts, USA.

Ravi Khanna, et al., "Microfabrication Protocols for Deep Reactive Ion Etching and Wafer–Level Bonding", *MicroStrain Materials Science*, Sensors Online.

Amit Mehra, et al., " A Six–Wafer Combustion System for a Silicon Micro Gas Turbine Engine", *Journal of Microelectromechanical systems*, Dec. 2000, 517–527pp, vol. 9, No. 4, IEEE.

* cited by examiner

*Primary Examiner*—Duy-Vu Deo
(74) *Attorney, Agent, or Firm*—Rothwell, Figg, Ernst & Manbeck, P.C.

(57) ABSTRACT

A method of through-etching a substrate that is simplified and by which the flow of ions can be kept to be regular during a plasma dry etching process, is provided. According to this method, a buffer layer is formed on a first plane of the substrate, a metal layer is formed on the buffer layer, an etching mask pattern is formed on a second plane opposite to the first plane, and the substrate is through-etched with the etching mask pattern as an etching mask. Preferably, the substrate is formed of a single-crystal silicon, the buffer layer is formed of silicon dioxide, and the metal layer is formed of aluminum.

19 Claims, 7 Drawing Sheets

METHOD OF THROUGH-ETCHING SUBSTRATE

BACKGROUND OF THE INVENTION

1. Field of the Invention

The present invention relates to a method of through-etching a substrate, which is an important technique in manufacturing a three-dimensional microelectromechanical system (MEMS).

2. Description on the Related Art

A microelectromechanical system (MEMS) is referred to as an ultra-small system or a system made of ultra-small machine parts of several micrometers or several millimeters. Also, the MEMS is an integrated microelement that is coupled with electric machine parts and mechanical machine parts and manufactured via batch-type process techniques used in manufacturing semiconductor integrated circuits.

Today, use of the MEMS has been rapidly spreading because it is a compact, portable, and efficient thermodynamic energy system. In particular, a lot of interest is centered on developing the structure, functions, and techniques of manufacturing a three-dimensional (3-D) MEMS that is a multi-layered structure of several silicon substrates, each having a recess region and a penetration region of a regular form. For example, techniques of through-etching a silicon substrate have been continuously developed.

A lot of effort to develop the technique of through-etching a substrate has been undertaken by the Gas Turbine Laboratory of Massachusetts Institute of Technology (MIT) since 1995. For example, the recent trends regarding techniques of through-etching a substrate are introduced by Ravi Khanna et al. of MIT in a report entitled "Microfabrication Protocols for Deep Reactive Ion Etching and Wafer-Level Bonding" [*Sensors*, April 2001]. Also, an example of a method of through-etching a substrate applied to a power MEMS is disclosed in a report entitled "Demonstration of a Microfabricated High-Speed Turbine Supported on Gas Bearings" written by Luc. G. Frechette et al. of MIT [*Solid-State Sensor and Actuator Workshop*, June 2000]. Further, an example of a method of through-etching a substrate applied to micro gas turbine is disclosed in a report entitled "A Six-Wafer Combustion System for a Silicon Micro Gas Turbine Engine" [Amit Mehra et al., *Journal of Microelectromechanical Systems*, vol. 9, No. 4, December 2000].

FIGS. 1 through 5 are cross-sectional diagrams explaining a conventional method of through-etching a substrate used in the MEMS, which is disclosed in "Microfabrication Protocols for Deep Reactive Ion Etching and Wafer-Level Bonding" introduced by Ravi Khanna et al. of MIT [*Sensors*, April 2001].

Referring to FIG. 1, a photoresist layer 12 is formed on a wafer substrate 10 to be etched. Next, a photoresist pattern, which exposes a portion of the wafer substrate 10, is formed by performing an exposure process and a developing process, which are generally adopted during a process of manufacturing semiconductor devices, on the wafer substrate 10 having the photoresist layer 12.

Referring to FIG. 2, with the photoresist pattern as an etching mask, a portion of the wafer substrate 10 is dry etched to form a recess region 10a of a trench shape in the wafer substrate 10. Then, the photoresist pattern 12 is stripped to be removed.

Referring to FIG. 3, in order to penetrate the recess region 10a, the side of the wafer substrate 10 having the recess region 10a is adhered to a handling wafer 20 via a photoresist layer 14. Preferably, the handling wafer 20 is formed of a hard material such as quartz or silicon.

The reason why the handling wafer 20 is used during the through-etching of the wafer substrate 10 is to prevent helium gas from leaking into an etching chamber. In detail, the wafer substrate 10 to be etched is loaded onto a stage installed at a central lower portion of the etching chamber and then is dry etched using plasma. At this time, in order to cool the heat generated in the wafer substrate 10, helium gas, which is cooled to a predetermined temperature, is introduced into the stage to reach the bottom of the wafer substrate 10. However, when a hole is formed at a portion of the wafer substrate 10 that is passed through, the introduced helium gas leaks into the etching chamber, thereby polluting the etching chamber and changing the etching process conditions. Therefore, the handling wafer 20 is used to prevent the leakage of the helium gas into the etching chamber.

After adhering the wafer substrate 10 to the handling wafer 20, a photoresist layer 16, as shown in FIG. 4, is formed on the side opposite to the wafer substrate 10 having the recess region 10a. Then, as described above, the exposure and developing processes are performed on the photoresist layer 16 to form a photoresist pattern exposing a portion that includes the recess region 10a of the wafer substrate 10. Next, a combination of the wafer substrate 10 having the photoresist pattern and the handling wafer 20, is loaded onto the stage of the etching chamber. Then, with the photoresist pattern as an etching mask, the wafer substrate 10 is dry etched using plasma so as to be through-etched.

Then, referring to FIG. 5, after through-etching, the combination of the wafer substrate 10 and the handling wafer 20 is unloaded from the etching chamber, the handling wafer 20 is detached from the wafer substrate 10, and then the photoresist layers 14 and 16 are stripped to be removed.

The conventional method of through-etching a wafer substrate using a handling wafer, however, has the following problems:

i) resist burning may occur. That is, bubbles may form in the photoresist layer 14 positioned between the wafer substrate 10 and the handling wafer 20 during a plasma process;

ii) wafer breakage occurs. As shown in the "A" portions of FIG. 4, plasma ions hit the surface of the handling wafer 20, rebound therefrom at the end of the process of through-etching the wafer substrate 10, and then hit the sidewalls of the wafer substrate 10 again. As a result, the sidewalls of holes formed in the wafer substrate 10 are damaged;

iii) structure erosion occurs. The handling wafer 20 made of silicon or quartz has such a low heat conductivity that the etched wafer substrate 10 cannot be sufficiently cooled by helium gas. Thus a specific portion of the etched wafer substrate 10 is etched rapidly as if it would corrode; and iv) a lot of time is spent on detaching the handling wafer 20 from the wafer substrate 10. Acetone is used to detach the handling wafer 20 from the wafer substrate 10. However, since the handling wafer 20 was fast-coupled with the wafer substrate 10, several hours are lost in separating the handling wafer 20 from the wafer substrate 10.

SUMMARY OF THE INVENTION

To solve the above problems, it is a first object of the present invention to provide a method of through-etching a substrate that is simplified and only uses general techniques that are used in manufacturing semiconductor devices, without adhering a handling wafer to a wafer substrate.

It is a second object of the present invention to provide a method of through-etching a substrate, adopting a material of high heat conductivity rather than a handling wafer of low heat conductivity, by which cooling gas is prevented from leaking during through-etching, thereby sufficiently cooling the etched wafer substrate.

It is a third object of the present invention to provide a method of through-etching a substrate, adopting a material of high electric conductivity rather than a handling wafer of low electric conductivity, by which the flow of ions can be kept to be regular during a plasma dry etching process, thereby preventing the breakage of the sidewalls of an etched wafer substrate.

It is a fourth object of the present invention to provide a method of through-etching a substrate, by which after through-etching the substrate, all unnecessary layers except for the substrate are rapidly removed to shorten the processing time.

To achieve an aspect of the above objects, there is provided a method of through-etching a substrate, including forming a buffer layer on a first plane of the substrate; forming a metal layer on the buffer layer; forming an etching mask pattern on a second plane opposite to the first plane; and through-etching the substrate with the etching mask pattern as an etching mask.

This method may further include forming a recess region on the first plane before forming the buffer layer on the first plane. Also, forming the recess region may be performed by a photolithography which is well-known in manufacturing semiconductor devices.

After through-etching the substrate, this method may further include removing the etching mask pattern, removing the metal layer, and removing the buffer layer.

Preferably, the substrate is formed of a single-crystal silicon, the buffer layer is formed of silicon dioxide, and the metal layer is formed of aluminum.

To achieve another aspect of the above objects, there is provided a method of through-etching a substrate, including forming a recess region of a predetermined depth on a first plane of the substrate; forming a first buffer layer on the first plane of the substrate having the recess region; forming a first metal layer on the first buffer layer; forming a first etching mask pattern on a second plane of the substrate opposite to the first plane, for exposing at least a portion of a region corresponding to the recess region; and through-etching the substrate with the first etching mask pattern as an etching mask.

Preferably, forming the recess region on the first plane of the substrate includes forming a second etching mask pattern on the first plane of the substrate; etching a portion of the substrate with the second etching mask as an etching mask; and removing the second etching mask pattern. Preferably, the second etching mask pattern is a photoresist pattern, or a stacked structure including a second buffer layer and a second metal layer.

Preferably, the first etching mask pattern is a photoresist pattern, or a stacked structure including a third buffer layer and a third metal layer.

This method may further include wet-etching the first buffer layer that is exposed by the through-etching of the substrate.

Also, this method may further include, after through-etching the substrate, removing the first etching mask pattern that is the photoresist pattern; removing the first metal layer; and removing the first buffer layer. After through-etching the substrate, this method may further includes removing the third metal layer of the first etching mask pattern and the first metal layer; and removing the third buffer layer of the first etching mask pattern and the first buffer layer.

Preferably, through-etching the substrate is performed by DIRE, and a portion of the substrate, which is penetrated by the through-etching of the substrate, includes the recess region.

According to the present invention, instead of a handling wafer, a metal layer having superior heat conductivity and electrical conductivity is used to sufficiently cool the substrate during the through-etching of a substrate. Also, the flow of ions can be kept to be regular so that a plasma etching process can be successfully performed and pressure applied by a cooling gas can be sufficiently mitigated. Further, with the use of general techniques used in manufacturing semiconductor devices, a process of through-etching the substrate can be simplified and processing time can be shortened.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
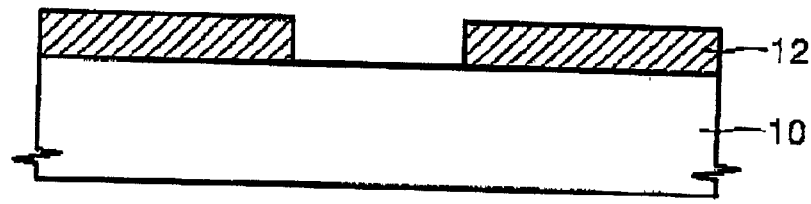
FIGS. 1 through 5 are cross-sectional diagrams explaining a conventional method of through-etching a substrate.
Figure 2:
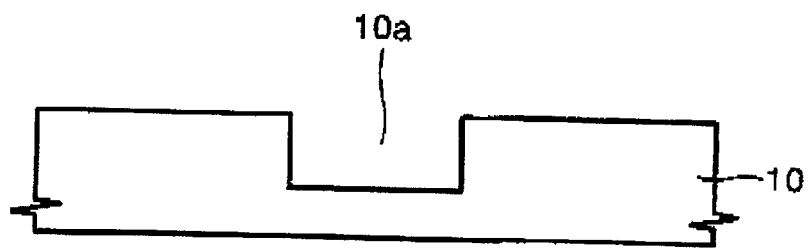
Figure 3:
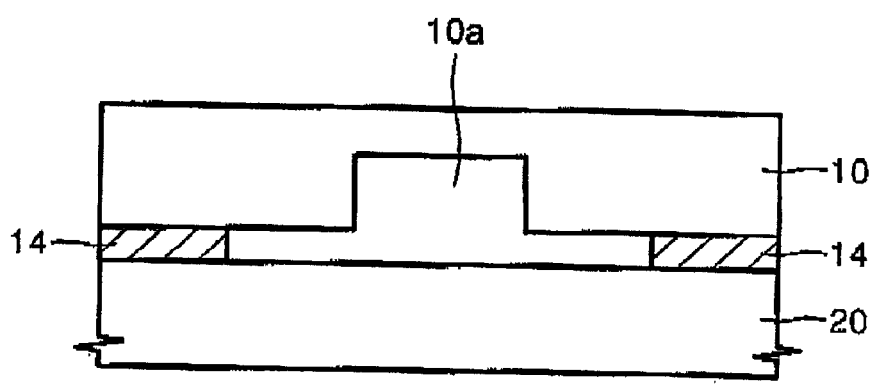
Figure 4:
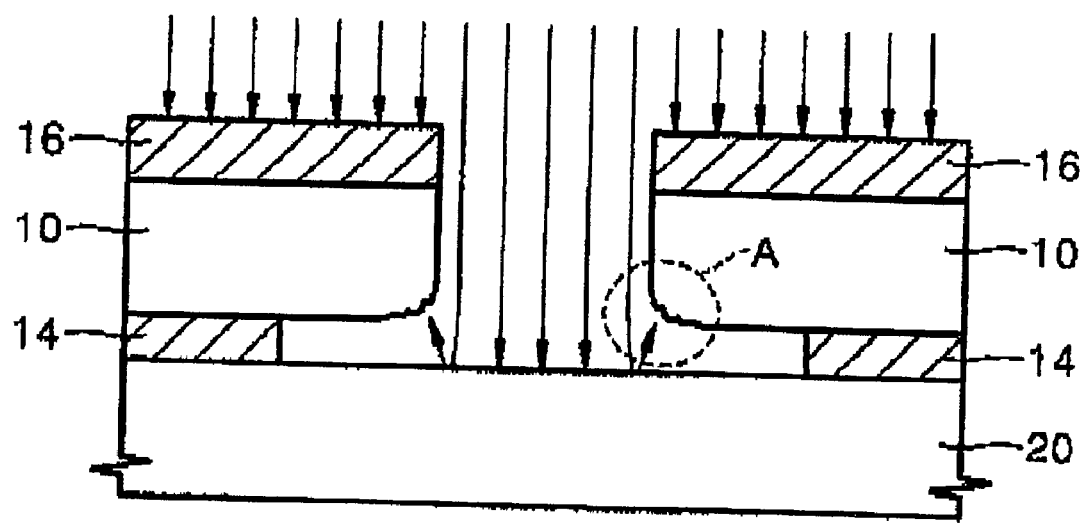
Figure 5:
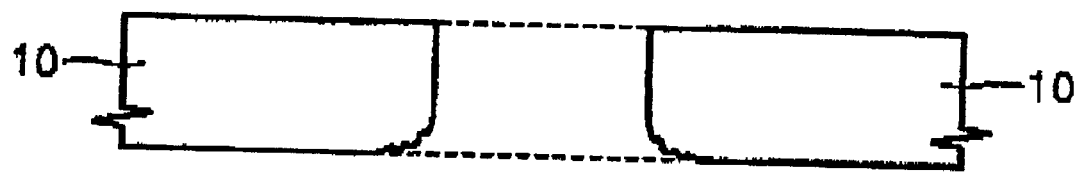

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it ca be directly on the other layer or substrate, or intervening layers may also be present. The same reference numerals in different drawings represent the same element, and thus their description will be omitted.

<First Embodiment>

FIGS. 6 through 13 are cross-sectional diagrams explaining a first embodiment of a method of through-etching a substrate according to the present invention. In the first embodiment, a substrate is through-etched by a two-step etching process.

Figure 6:
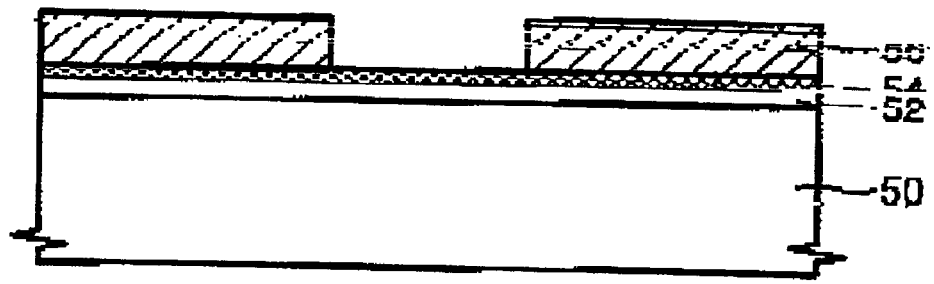
FIGS. 6 through 13 are cross-sectional diagrams explaining a first embodiment of a method of through-etching a substrate according to the present invention.

Referring to FIG. 6, a buffer layer 52, a metal layer 54 and an etching mask pattern 56 are sequentially formed on a substrate 50. In detail, the substrate 50, for example, may be a semiconductor wafer made of a single-crystal silicon. Before forming the buffer layer 52 on the substrate 50, the substrate 50 is cleaned at about 120° C., using a sulfuric peroxide mixture (SPM) solution in which $H_2SO_4:H_2O_2$ is 4:1, and then is dried by a spinning method. In this embodiment, the substrate 50 is formed to a thickness of 450 μm.

Next, the buffer layer 52 is formed of silicon dioxide ($SiO_2$), for example, to a thickness of about 1000 Å on the cleaned substrate 50 by plasma-enhanced chemical vapor deposition (PECVD). The $SiO_2$ layer has excellent step coverage. Thus even if the surface of the substrate 50 is patterned in some form, the $SiO_2$ layer can be completely deposited along the sidewalls of the substrate 50, thereby protecting the sidewalls thereof. Also, when manufacturing a 3-dimensional (3-D) microelectromechanical system (MEMS) by stacking and bonding several wafers, the $SiO_2$ layer can be used as a layer for protecting the surface of a wafer. However, the buffer layer 52 according to the present invention is not restricted to the $SiO_2$ layer and thus can be formed of various materials, within the scope of the invention.

Thereafter, the metal layer 54 is formed, for example, of an aluminum layer to a thickness of about 3000 Å on the buffer layer 52 by physical vapor deposition (PVD). The aluminum layer is deposited on the $SiO_2$ layer which is brittle, so that it compensates for the defects of the $SiO_2$ layer, and further, has excellent heat conductivity and electric conductivity. The metal layer 54 is not also restricted to an aluminum layer and can be formed of various metal materials, within the scope of the invention.

Then, the etching mask pattern 56 is formed of, for example, a photoresist pattern on the metal layer 54 by an exposure process and a developing process. In detail, prior to coating a photoresist on the metal layer 54, HexaMethylDisilizane (HMDS) is coated on the metal layer 54 in order to improve the adhering characteristics of the photoresist layer. Then, a photoresist having model No. AZ1512 is formed to a thickness of about 1.2 μm, using a spin coater and pre-baked in an oven whose temperature is kept to be about 95° C. for about 30 minutes.

Thereafter, an exposure process is performed on the photoresist, using a mask that was patterned in advance. In general, the exposure process is performed with a film mask at 12 mW for 12 second, and then with a chrome mask at 12 mW for 8.5 seconds. Then, the exposed portion of the photoresist is removed using a developing solution, which is a mixture of a developing solution and pure water (deionized water) at a ratio of 6:1, and then is rinsed with pure water for 6–7 minutes. Then, the photoresist is spin-dried for about 10 minutes, and post-baked in an oven whose temperature is kept to be 110° C. for about 30 minutes. As a result, the etching mask pattern 56 is formed.

Figure 7:
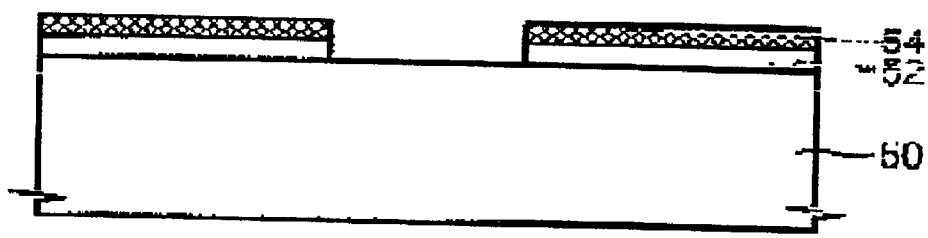

Then, referring to FIG. 7, with the etching mask pattern 56 as an etching mask, the metal layer 54, which is an aluminum layer, for example, is wet-etched so as to be removed. Here, the aluminum layer is etched at about 400° C. for 3–4 minutes, using an etching solution made of $H_3PO_4$:$HNO_3$:$CH_3COOH$:D.I. (deionized) water at a ratio of 16:1:1:2. Next, the substrate is dipped in a HF solution so as to wet-etch the exposed buffer layer 52. Then, the remaining photoresist layer is stripped for about 5 minutes so as to be removed, rinsed for about 5 minutes, and then dried. As a result, an etching mask pattern, which consists of the buffer layer 52 and the metal layer 54, is completed.

Figure 8:
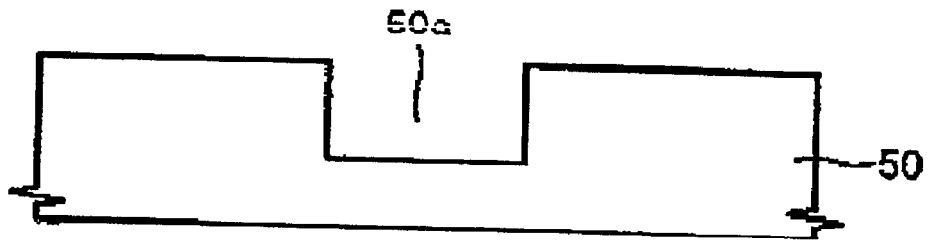

Referring to FIG. 8, the substrate 50 is plasma dry-etched using the etching mask pattern, which consists of the buffer layer 52 and the metal layer 54, illustrated in FIG. 7, as an etching mask. Here, a deep reaction ion etching (DIRE) process called 'Bosch Process' is used. The Bosch process is disclosed in a report entitled "Characterization of a Time Multiplexed Inductively Coupled Plasma Etcher" introduced by A. A. Ayon et al. [*Journal of The Electrochemical Society*, 146(1), pp. 339–349, 1999], and therefore, a detailed description thereof will be omitted. This embodiment is performed under the conditions that polymer coating time, bottom polymer removing time, and silicon etching time are 5, 3, and 6 seconds, respectively. The depth of a first recess region 50a, which is etched and removed from the substrate 50, is formed to about 250 μm.

Subsequently, the aforementioned of an etching solution, in which the ratio of $H_3PO_4$:$HNO_3$:$CH_3COOH$:D.I. water is 16:1:1:2, is used to wet-etch and remove the aluminum metal layer 54 for 60–90 minutes. The $SiO_2$ buffer layer 52 is removed in a HF solution. Thus, as shown in FIG. 8, the first recess region 50a is formed at a portion of the substrate 50 in the first step of the etching process.

Figure 9:
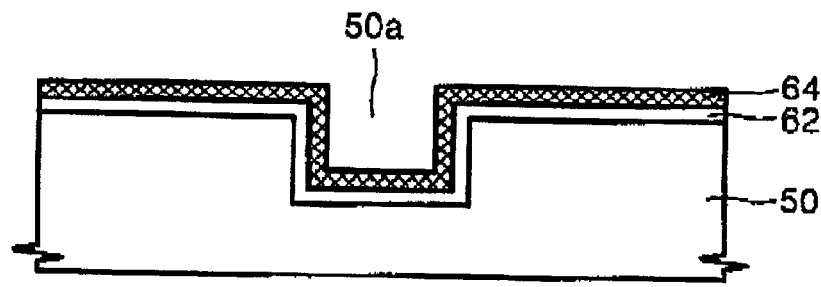

Referring to FIG. 9, the substrate 50 having the first recess region 50a is sufficiently cleaned with the aforementioned SPM solution that is mixed with $H_2SO_4$ and $H_2O_2$ at a ratio of 4:1, and then is dried. Therefore, a buffer layer 62 is formed of, for example, a TEOS oxide layer to a thickness of about 5000 Å on the side of the substrate 50 having the first recess region 50a by the PECVD method. Next, a metal layer 64 is formed of, for example, an aluminum layer to a thickness of about 3000 Å on the buffer layer 62 by the PVD method.

Figure 10:
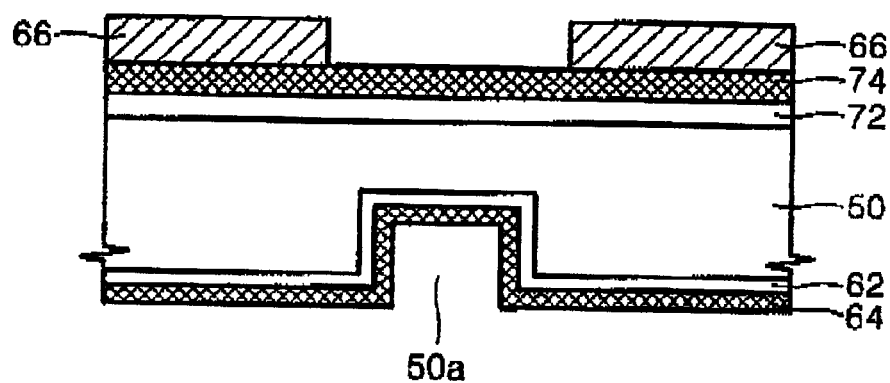

Referring to FIG. 10, a buffer layer 72 is formed of, for example, a TEOS oxide layer to a thickness of about 1000 Å on the side opposite to the substrate 50 having the first recess region 50a, by PECVD. Then, a metal layer 74 is formed of, for example, aluminum to a thickness of about 3000 Å on the buffer layer 72 by PVD.

Then, as explained with reference to FIG. 6, an etching mask pattern 66, for example, a photoresist pattern, is formed on the metal layer 74 by an exposure process and a developing process (refer to the description with reference to FIG. 6, for more details). Briefly, prior to coating a photoresist on the metal layer 74, HexaMethylDiSilizane (HMDS) is applied onto the metal layer 74. Then, the photoresist is formed on the metal layer 74 by a spin coater and pre-baked in an oven. Thereafter, the exposed process is performed on the photoresist using a mask that was patterned in advance. Then, the exposed portion of the photoresist is developed and removed using a developing solution, rinsed with pure water, and spin-dried. Next, the dried photoresist is post-baked in an oven. As a result, the etching mask pattern 66 is formed.

Figure 11:
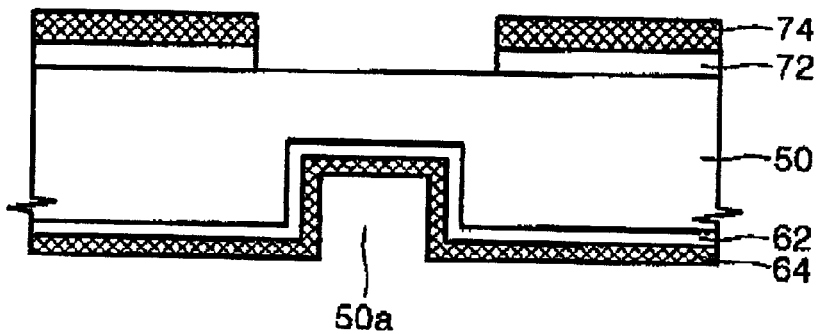

Referring to FIG. 11, with the etching mask pattern 66 as an etching mask, the metal layer 74, which is, for example, an aluminum layer is wet-etched and removed. Here, the aluminum layer is etched using an etching solution that is mixed with $H_3PO_4$, $HNO_3$, $CH_3COOH$, and D.I. water at a ratio of 16:1:1:2, respectively, as described above. Next, the aluminum layer is dipped in an HF solution to wet-etch and remove the exposed buffer layer 72. Then, the remaining photoresist layer is stripped so as to be removed, then rinsed and dried. As a result, an etching mask pattern, which consists of the buffer layer 72 and the metal layer 74, is completed.

Figure 12:
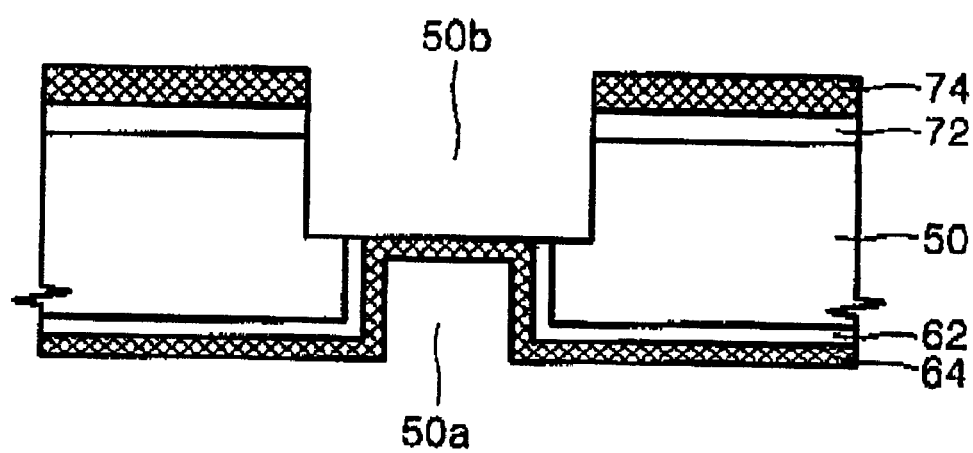

Referring to FIG. 12, the substrate 50 is plasma dry-etched with the etching mask pattern, which consists of the buffer layer 72 and the metal layer 74, as an etching mask. As described above, during through-etching, a DRIE process called Bosch process is adopted. This embodiment is performed on the condition that polymer coating time, bottom polymer removal time, and silicon etching time are 5, 3, and 6 seconds, respectively. As a result, a second recess region 50b is formed to a depth of about 200 μm so that the substrate 50 is through-etched.

Next, a portion of the buffer layer 62 is exposed at the bottom of the second recess region 50b. If this portion of the buffer layer 62 is etched and removed with low etching selectivity, the surface of the metal layer 64 below the buffer layer 62 is exposed.

Then, the aforementioned etching solution that is mixed with $H_3PO_4$, $HNO_3$, $CH_3COOH$ and D.I. water at a ratio of 16:1:1:2, respectively, is used to wet-etch and remove the aluminum layers 64 and 74, and the buffer layers 62 and 72 remaining in the HF solution are removed.

Figure 13:
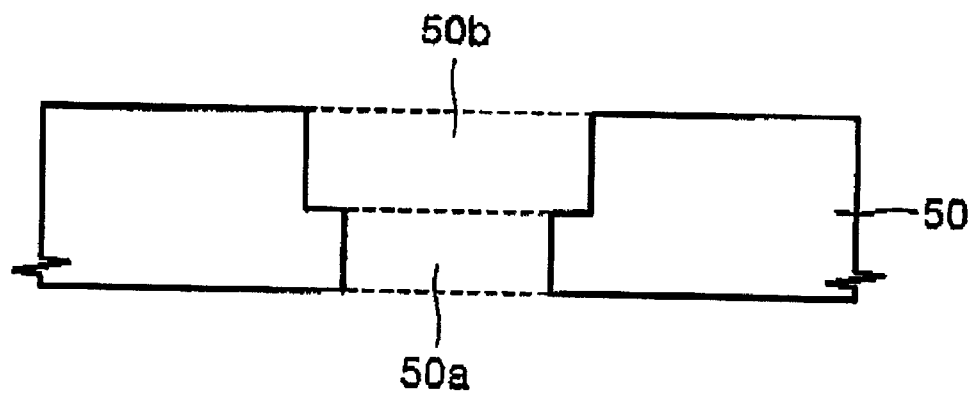

Accordingly, as shown in FIG. 13, the first and second recess regions 50a and 50b are connected with each other by the two-step etching process. As a result, the substrate 50 is completely through-etched by the first and second recess regions 50a and 50b.

<Second Embodiment>

FIGS. 14 through 17 are cross-sectional diagrams explaining a second embodiment of a method of through-etching a substrate 90. In the second embodiment, the substrate 90 is through-etched by a one-step etching process. Detailed descriptions on components that are the same as those of the first embodiment will be omitted here.

Figure 14:
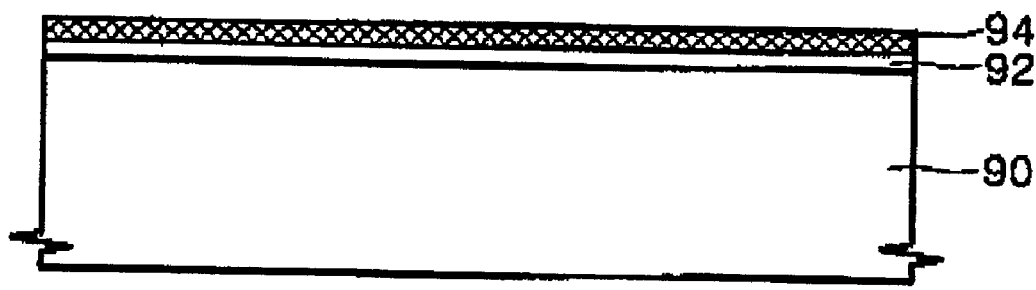
FIGS. 14 through 17 are cross-sectional diagrams explaining a second embodiment of a method of through-etching a substrate according to the present invention.

Referring to FIG. 14, a buffer layer 92 and a metal layer 94 are sequentially formed on the substrate 90. The substrate 90 may be a semiconductor wafer made of a single-crystal silicon. Prior to the formation of the buffer layer 92 thereon, the substrate 90 is sufficiently cleaned with an SPM solution that is mixed with $H_2SO_4$ and $H_2O_2$ at a ratio of 4:1, and then is dried. Next, the buffer layer 92 is formed of silicon dioxide $SiO_2$ to a thickness of about 1000 Å on the cleaned substrate 90 by the PECVD. Then, the metal layer 94 is formed of, for example, aluminum to a thickness of about 3000 Å on the metal layer 94 by the PVD.

Figure 15:
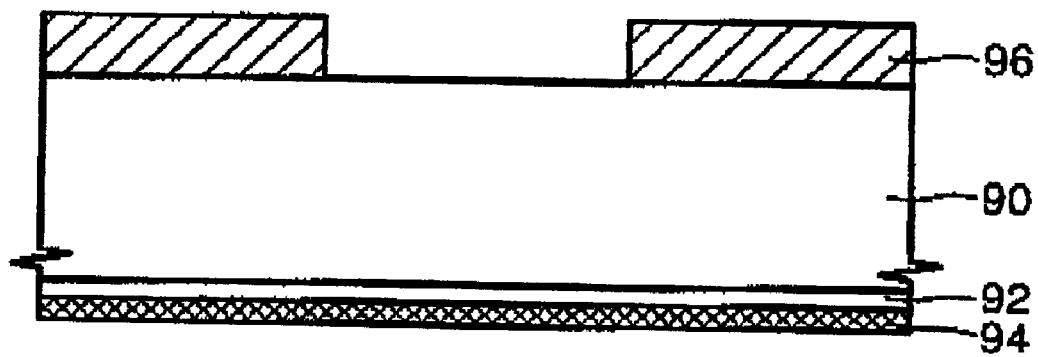

Referring to FIG. 15, an etching mask pattern 96, for example, a photoresist pattern, is formed on the side opposite to the substrate 90 having the buffer layer 92 and the metal layer 94 by an exposure process and a developing process as in the first embodiment.

Figure 16:
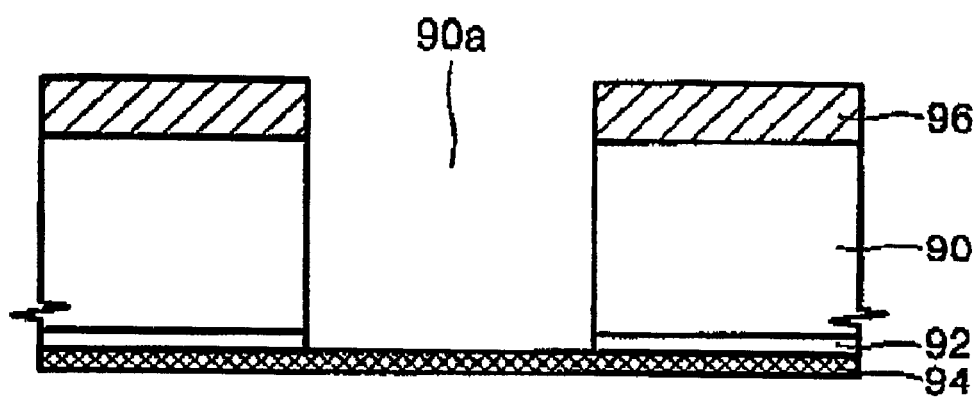

Referring to FIG. 16, with the etching mask pattern 96 as an etching mask, the substrate 90 is etched until the buffer layer 92 is exposed. As a result, a hole 90a, which passes through the substrate 90, is formed. Here, the aforementioned DRIE process is used to etch the substrate 90. Therefore, the substrate 90 can be through-etched by the one-step etching process.

Thereafter, a portion of the buffer layer 92, which is exposed at the bottom of the hole 90a, is etched and removed with low selectivity, and thus the metal layer 94 below the buffer layer 92 is exposed. Then, the photoresist etching mask pattern 96 is stripped and removed. Next, the aforementioned etching solution that is mixed of $H_3PO_4$, $HNO_3$, $CH_3COOH$ and D.I. water at a ratio of 16:1:1:2, respectively, is used to wet-etch and remove the aluminum metal layer 94 and to remove the buffer layer 92 remaining in the HF solution.

Figure 17:
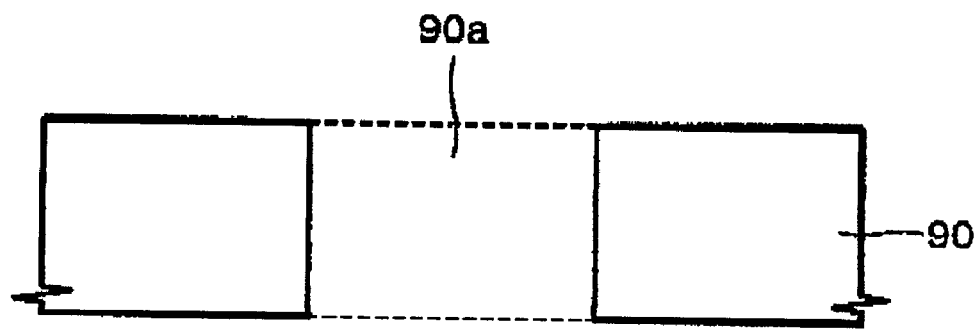

Accordingly, as shown in FIG. 17, the substrate 90 having the hole 90a is completely through-etched by the one-step etching process.

The above first and second embodiments are techniques of through-etching each substrate when manufacturing a 3-D MEMS. However, the present invention is not restricted to these embodiments, and can be embodied in many different forms within the scope of the invention.

For instance, in the first embodiment, the etching mask pattern, which consists of the buffer layer 52 and the metal layer 54, is used to form the first recess region 501 of FIG. 8. However, the etching mask pattern can be variously formed. That is, the etching mask pattern may be formed of a material having an etching selectivity with respect to the substrate 50 made of a silicon, e.g., a single photoresist pattern or an etching mask pattern which consists of an oxide layer and a nitride layer.

In the second embodiment, a single photoresist pattern is used as the etching mask pattern 96 to form the hole 90a. However, an etching mask pattern that is a stacked structure including the buffer layer 52 and the metal layer 54 or a stacked structure including an oxide layer and a nitride layer may be used.

Also, in the first and second embodiments, a buffer layer and a metal layer are formed of $SiO_2$ and aluminum, respectively. However, the buffer layer and the metal layer can be formed of various metals, or of a combination of metal and a substance layer having excellent adhering characteristics.

Meanwhile, these embodiments are briefly described with regard to a method of through-etching a substrate, but each wafer substrate constituting a multilayered structure of a 3-D MEMS has patterns on its surface so that it can be appropriately structured to fit the functions of the MEMS. Thus, the upper and lower sides of the respective wafer substrate may be through-etched according to the same patterns or different patterns. For instance, holes passing through a substrate can be formed by forming shallow recess regions at the top of a selected wafer, and then through-etching regions including or excluding these shallow recess regions, as explained in the first and second embodiments.

The structure of the 3-D MEMS is specifically disclosed in U.S. Pat. No. 5,932,940 owned by MIT, and this disclosure is also cited as reference material.

Meanwhile, in the first and second embodiments of the present invention, a portion of a substrate is particularly illustrated and described for convenience' sake. However, in fact, several units are respectively integrated on each wafer, which is a layer constituting a multi-layered structure of the 3-D MEMS by performing various processes on the respective wafer. Then, wafers are bonded with one another and then are cut into a plurality of units. As a result, several 3-D MEMS are obtained.

Each wafer, which is formed as the respective layer constituting the 3-D MEMS, on which a method of through-etching a substrate, according to the present invention, is performed, is sufficiently cleaned by the aforementioned SPM cleaning solution or an RCA cleaning solution, which is a mixture of $NH_4OH$, $H_2O_2$ and D.I water at a ratio of 1:1:5, and is manufactured by RCA, an American a corporation. Then, all the wafers are pre-bonded by an aligner and are finally bonded with one another by annealing the surfaces of the wafers in a furnace.

A method of through-etching a substrate, according to the present invention, can be applied to various 3-D MEMS such as automobile systems including a micro mirror array projector, a micro accelerometer, a micro gyroscope, and a tire pressure sensor; a laboratory-on-chip (LOC); and a DNA chip. Further, this method can be applied to a power MEMS such as micro gas turbine engine, a micro turbine, and a micro combustor.

As described above, according to the present invention, a metal material takes the place of a conventional handling wafer having low heat conductivity and low electrical conductivity, thereby effectively refrigerating a substrate heated during the through-etching process. At the same time, during through-etching, plasma ions can smoothly flow via the metal material, thereby obtaining good-quality profile whose patterns around the through-etched holes are not damaged.

Also, according to the present invention, due to the ductility of a metal material, it is possible to properly mitigate the pressure applied by helium gas, which is supplied to the bottom of a substrate during through-etching. Further, a buffer layer is adopted to prevent damage to the substrate caused by a metal substance layer.

In addition, according to the present invention, since aluminum, which is commonly used in a process of manufacturing semiconductor devices, is used, the deposition or removal thereof can be easily performed. Further, it is possible to reduce process time required, thereby increasing the yield.

What is claimed is:

1. A method of through-etching a substrate, the method comprising:
   forming a buffer layer on a first plane of the substrate;
   forming a metal layer on the buffer layer;
   forming an etching mask pattern on a second plane opposite to the first plane;
   through-etching the substrate with the etching mask pattern as an etching mask;
   removing the etching mask pattern;
   removing the metal layer; and
   removing the buffer layer.

2. The method of claim 1, further comprising forming a recess region on the first plane before forming the buffer layer on the first plane.

3. The method of claim 1, wherein the substrate is formed of a single-crystal silicon.

4. The method of claim 1, wherein the buffer layer is formed of silicon dioxide.

5. The method of claim 1, wherein the metal layer is formed of aluminum.

6. The method of claim 1, wherein through-etching the substrate is performed by deep reaction ion etching (DRIE).

7. A method of through-etching a substrate, the method comprising:
   forming a recess region of a predetermined depth on a first plane of the substrate;
   forming a first buffer layer on the first plane of the substrate having the recess region;
   forming a first metal layer on the first buffer layer,
   forming a first etching mask pattern on a second plane of the substrate opposite to the first plane, for exposing at least a portion of a region corresponding to the recess region;
   through-etching the substrate with the first etching mask pattern as an etching mask;
   removing the first etching mask pattern that is the photoresist pattern;
   removing the first metal layer; and
   removing the first buffer layer.

8. The method of claim 7, wherein forming the recess region on the first plane of the substrate comprises:
   forming a second etching mask pattern on the first plane of the substrate;
   etching a portion of the substrate with the second etching mask as an etching mask; and
   removing the second etching mask pattern.

9. The method of claim 8, wherein the second etching mask pattern is a photoresist pattern.

10. The method of claim 8, wherein the second etching mask pattern is a stacked structure comprising a second buffer layer and a second metal layer.

11. The method of claim 7, wherein the first etching mask pattern is a photoresist pattern.

12. The method of claim 7, wherein the first etching mask pattern is a stacked structure comprising a third buffer layer and a third metal layer.

13. The method of claim 12, after through-etching the substrate, further comprising:
   removing the third metal layer of the first etching mask pattern and the first metal layer; and
   removing the third buffer layer of the first etching mask pattern and the first buffer layer.

14. The method of claim 7, further comprising wet-etching the first buffer layer that is exposed by the through-etching of the substrate.

15. The method of claim 7, wherein the substrate is formed of a single-crystal silicon.

16. The method of claim 7, wherein the buffer layer is formed of silicon dioxide.

17. The method of claim 7, wherein the metal layer is formed of aluminum.

18. The method of claim 7, wherein through-etching the substrate is performed by DRIE.

19. The method of claim 7, wherein a portion of the substrate which is penetrated by the through-etching of the substrate comprises the recess region.

* * * * *